United States Patent [19]

Goto

[11] Patent Number: 5,151,621
[45] Date of Patent: Sep. 29, 1992

[54] HIGH SPEED OUTPUT BUFFER UNIT THAT PRELIMINARILY SETS THE OUTPUT VOLTAGE LEVEL

[75] Inventor: Hiroyuki Goto, Tokyo, Japan
[73] Assignee: NEC Corporation, Tokyo, Japan
[21] Appl. No.: 743,061
[22] Filed: Aug. 9, 1991
[30] Foreign Application Priority Data
Aug. 9, 1990 [JP] Japan ................................. 2-211225
[51] Int. Cl.⁵ ......................................... H03K 19/0175
[52] U.S. Cl. .................................... 307/475; 307/443; 307/473
[58] Field of Search ......................... 307/443, 473, 475

[56] References Cited

U.S. PATENT DOCUMENTS

| | | | |
|---|---|---|---|
| 4,604,731 | 8/1986 | Konishi | 307/475 |
| 4,697,107 | 9/1987 | Haines | 307/475 |
| 4,963,774 | 10/1990 | Masuda | 307/443 |
| 4,988,888 | 1/1991 | Hirose et al. | 307/443 |

Primary Examiner—Edward P. Westin
Assistant Examiner—Benjamin D. Driscoll
Attorney, Agent, or Firm—Sughrue, Mion, Zinn, Macpeak & Seas

[57] ABSTRACT

An output buffer unit·comprises a controlling circuit responsive to an input data signal for producing a first controlling signal and a driving circuit implemented by a series combination of a p-channel type field effect transistor and an n-channel type field effect transistor complementarily shifted between on and off states for producing an output data signal, and a gating circuit is provided in association with the driving circuit so as to transfer a second controlling signal produced from the previous output data signal stored in a latching circuit to the field effect transistor for preliminarily changing the voltage level of an output data signal and, thereafter, to transfer the first controlling signal to the field effect transistor for finally determining the voltage level of the next output data signal so that the voltage level at the output node of the driving circuit quickly crosses over a discriminating level.

6 Claims, 5 Drawing Sheets

HIGH SPEED OUTPUT BUFFER UNIT THAT PRELIMINARILY SETS THE OUTPUT VOLTAGE LEVEL

FIELD OF THE INVENTION

This invention relates to an output buffer unit and, more particularly, to an output buffer unit for preliminarily setting an intermediate output voltage level for speeding up.

DESCRIPTION OF THE RELATED ART

A typical example of the output buffer unit incorporated in a semiconductor memory device is illustrated in FIG. 1, and largely comprises a controlling circuit 1 and a driving circuit 2. The controlling circuit 1 is implemented by two NAND gates 1a and 1b, an inverting circuit 1c and a NOR gate 1d. The two-input NAND gate 1a is supplied with a chip select signal CS of an active high voltage level and a write enable signal WE of an active low level, and the two-input NAND 1a yields a strobe signal of the active low voltage level when the semiconductor memory device enters a read-out phase of operation. The NAND gate 1b and the NOR gate 1d are of the type having two input nodes, and an internal read-out data signal DB is distributed to both NAND and NOR gates 1b and 1d. The strobe signal is supplied to the NOR gate 1d directly, and to the NAND gate 1b through the inverting circuit 1c. For this reason, the NOR gate 1d and the NAND gate 1b are simultaneously activated in the presence of the strobe signal of the active low voltage level, and are responsive to the internal read-out data signal DB. Namely, if the internal read-out data signal DB is in the high voltage level corresponding to logic "1" level, both of the NAND gate 1b and the NOR gate 1d yield respective output signals of the low voltage level. However, both of the NAND gate 1b and the NOR gate 1d shift the respective output signals to the high voltage level in the presence of the internal read-out data signal DB of the low voltage level or logic "0" level.

The driving circuit 2 is implemented by a series combination of a p-channel enhancement type field effect transistor 2a and an n-channel type enhancement type field effect transistor 2b coupled between a source of positive voltage level Vcc and a ground node. The common drain node 2c is coupled to an output pin 3 as well as to a series combination of inverting circuits 4a, 4b and 4c. The output signals of the NAND gate 1b and the NOR gate 1d are supplied to the p-channel enhancement type field effect transistor 2a and the n-channel enhancement type field effect transistor 2b, respectively, and the p-channel enhancement type field effect transistor 2a and the n-channel enhancement type field effect transistor 2b complementarily turn on and off to change the voltage level at the common drain node 2c. The driving circuit 2 is expected to widely drive a large amount of parasitic capacitance coupled to the output pin 3, and, for this reason, both of the p-channel enhancement type field effect transistor 2a and the n-channel type enhancement type field effect transistor 2b are large in size.

Assuming now that an address signal changes an address at time t1 in the read-out phase of operation, the semiconductor memory device allows a data bit of logic "0" level to be read out from a memory cell indicated by the new address, and the internal read-out data signal DB is decayed at time t2 (FIG. 2). As described hereinbefore, the strobe signal has already been supplied to the NAND gate 1b and the NOR gate 1d, and the NAND gate 1b and the NOR gate 1d produce the respective output signals of the high voltage level. The output signals of the high voltage level shifts the n-channel enhancement type field effect transistor 2b toward the on-state, and the p-channel enhancement type field effect transistor 2a is shifted toward the off-state. Since a large amount of parasitic capacitance is coupled to the gate electrode of each of the large-sized component transistor 2a and 2b of the driving circuit 2, the switching speed is relatively low, and a prolonged time period is consumed until the common drain node 2c reaches a discriminating voltage level of, for example, 0.8 volts for a TTL interface at time t3. Thus, the prior art output buffer unit has a problem in low operation speed.

Another problem inherent in the prior art output buffer unit is noise produced in the source of positive voltage level Vcc and the ground node. This is because of the fact that the large-sized component transistors 2a and 2b allow a large amount of current to flow between the source of positive voltage level Vcc and the ground node. The large amount of current is causative of the undesirable noise.

SUMMARY OF THE INVENTION

It is therefore an important object of the present invention to provide an output buffer unit which is free from the problems inherent in the prior art output buffer unit.

To accomplish these objects, the present invention proposes to preliminarily set the voltage level at a common drain node of a driving circuit.

In accordance with the present invention, there is provided an output buffer unit comprising a) a controlling circuit responsive to an input signal for forming a first controlling signal, b) a driving circuit implemented by a series combination of a first transistor of a first channel conductivity type and a second transistor of a second channel conductivity type opposite to the first channel conductivity type, the first and second transistors being complementarily shifted between on and off states for producing an output signal at an output node between the first and second transistors, c) a latching circuit operative to temporarily store a previous output signal supplied from the output node and producing a second controlling signal, and d) a gating circuit having a first input port coupled to the controlling circuit, a second input port coupled to the latching circuit and an output port coupled to the first and second transistors, and responsive to a timing signal for transferring the second controlling signal to the first and second transistors in a first phase of operation, the gating circuit being operative to supply the first controlling signal to the first and second transistors in a second phase of operation after the first phase.

BRIEF DESCRIPTION OF THE DRAWINGS

The features and advantages of the output circuit according to the present invention will be more clearly understood from the following description taken in conjunction with the accompanying drawings in which.

DESCRIPTION OF THE PREFERRED EMBODIMENTS

First Embodiment

Figure 3:
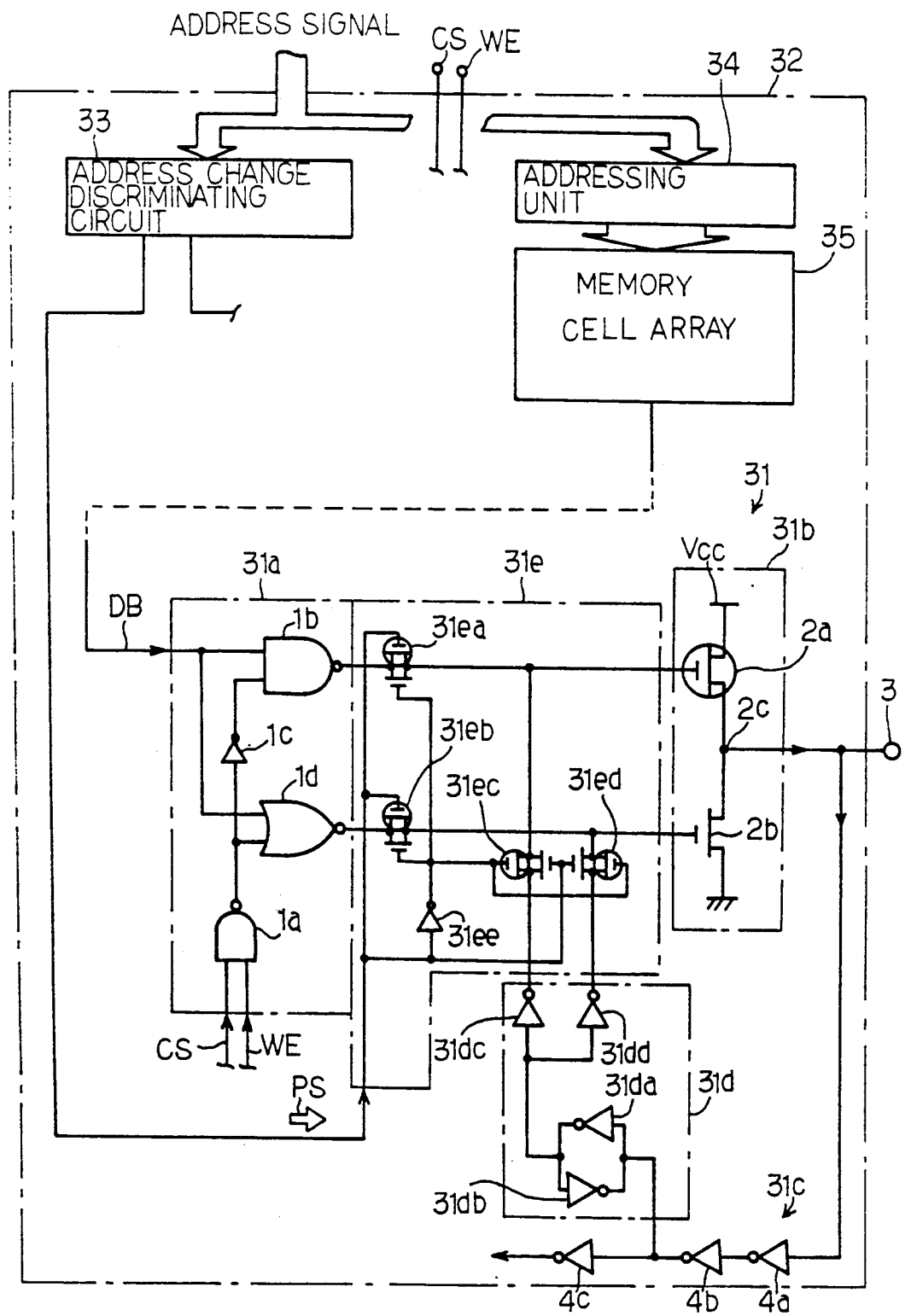
FIG. 3 is a circuit diagram showing the arrangement of an output buffer unit according to the present invention and incorporated in a semiconductor memory device.

Referring to FIG. 3 of the drawings, a semiconductor memory device equipped with an output buffer unit 31 embodying the present invention is fabricated on a semiconductor chip 32, and further comprises an address change discriminating circuit 33, an addressing unit 34 and a memory cell array 35. The address change discriminating circuit 33 usually triggers a timing signal generating circuit (not shown), and the arrangement is well known to a person skilled in the art. Although other peripheral units are further incorporated in the semiconductor memory device, they are not shown in FIG. 3, because the other peripheral units are less important to the understanding of the gist of the present invention. In the following description, logic "1" and logic "0" are assumed to correspond to a high voltage level of about 5 volts and the ground voltage level, respectively.

Figure 1:
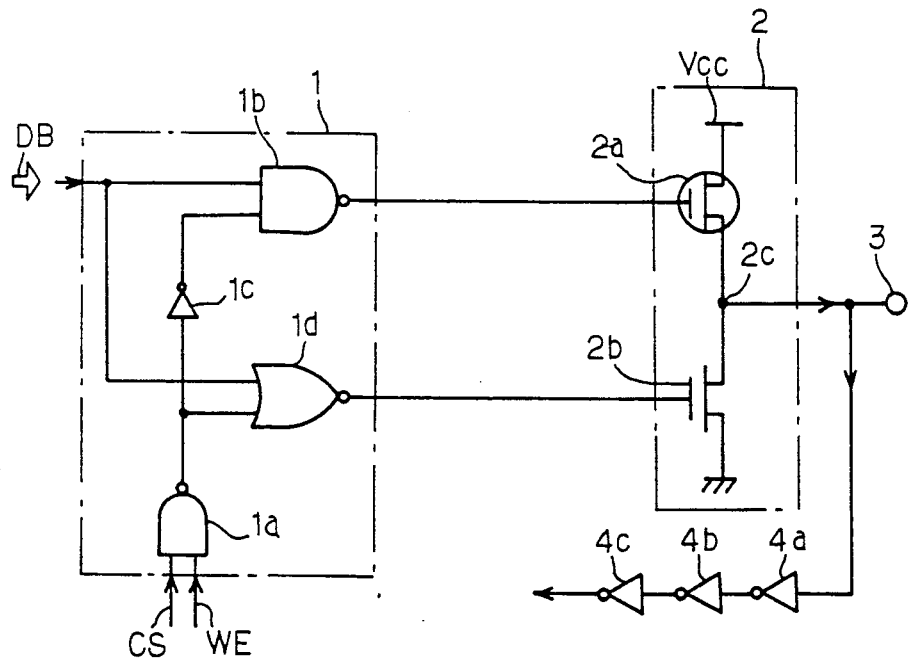
FIG. 1 is a circuit diagram showing the arrangement of the prior art output buffer unit incorporated in a semiconductor memory device.

The output buffer unit 31 implementing the first embodiment largely comprises a controlling circuit 31a, a driving circuit 31b, a series combination of inverting circuits 31c, a latching circuit 31d and a gating circuit 31e. However, the controlling circuit 31a, the driving circuit 31b and the series combination 31c are similar to those of the prior art output buffer unit, and, for this reason, the circuit component elements are labeled with the same reference signs used in FIG. 1 without detailed description. In this instance, the output signal of the NAND gate 1b and the output signal of the NOR gate 1d form, in combination, a first controlling signal, and the p-channel enhancement type field effect transistor 2a and the n-channel enhancement type field effect transistor 2b serve as first and second transistors, respectively. Since a NAND gate and a NOR gate serve as inverting circuits in the presence of the strobe signal, the first controlling signal is indicative of the complementary bit of a data bit indicated by the internal read-out data signal DB fed from the memory cell array 35.

The latching circuit 31d comprises two inverting circuits 31da and 31db, whereby the input nodes of the inverting circuits 31da and 31db are coupled to the output nodes of the other inverting circuits 31db and 31da thereby forming a flip-flop configuration. The output node of the inverting circuit 4b is coupled to the input node of the inverting circuit 31da, the output data signal at the common drain node 2c is stored in the latching circuit 31d. The output node of the inverting circuit 31da is further coupled in parallel to the input nodes of inverting circuits 31dc and 31dd, and the output signals of the inverting circuits 31dc and 31dd serve as the second controlling signal. The second controlling signal corresponds to the output data signal supplied from the common drain node 2c.

The gating circuit 31e comprises first transfer gates 31ea and 31eb coupled between the controlling circuit 31a and the driving circuit 31b, and second transfer gates coupled between the latching circuit 31d and the driving circuit 31b. Each of the first and second transfer gates 31ea to 31ed is formed by a parallel combination of a p-channel enhancement type field effect transistor and an n-channel enhancement type field effect transistor, and the first transfer gates 31ea and 31eb and the second transfer gates 31ec and 31ed respectively provide a first input port coupled to the controlling circuit 31a and a second input port coupled to the latching circuit 31d. The address change discriminating circuit 33 produces a timing pulse signal PS upon the address indicated by the address signal changing, and the timing pulse signal PS is kept in the high voltage level for a predetermined time period. While the timing pulse signal PS is in the high voltage level, the output buffer unit 31 remains in the first phase of operation. When the timing pulse signal PS is recovered from the high voltage level to the low voltage level, the output buffer unit 31 enters the second phase of operation. The inverting circuit 31ee yields the complementary signal of the timing pulse signal PS, and the first and second transfer gates 31ea to 31ed are responsive to the timing pulse signal PS and the complementary signal thereof. Namely, while the timing controlling signal PS remains in the high voltage level, the second transfer gates 31ec and 31ed turn on to transfer the second controlling signal to the driving circuit 31b, and the first transfer gates 31ea and 31eb are kept off. However, when the timing pulse signal PS is decayed to the low voltage level, the first transfer gates 31ea and 31eb turn on to transfer the first controlling signal to the driving circuit 31b, and the second transfer gates 31ec and 31ed turn off. Thus, the gating circuit 31e couples the latching circuit 31d to the driving circuit 31b in the first phase of operation, and, then, couples the controlling circuit 31a to the driving circuit 31b in the second phase of operation.

Figure 4:
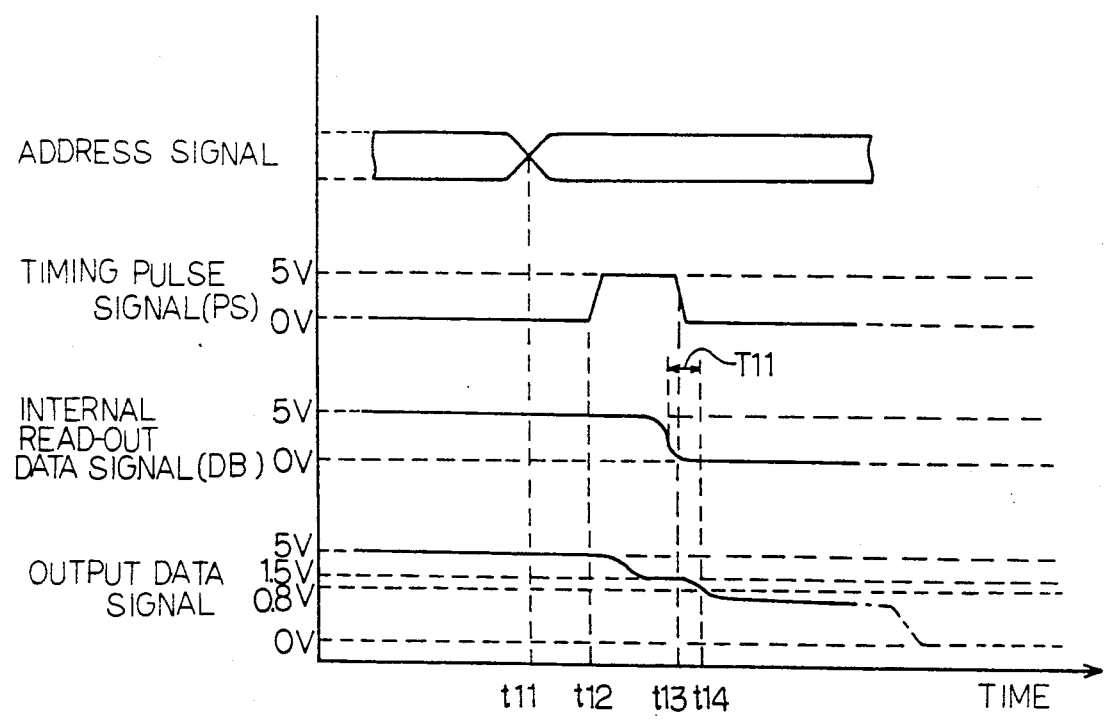
FIG. 4 is a timing chart showing the circuit behavior of the output buffer unit shown in FIG. 3.

Description is hereinbelow made on the circuit behavior of the semiconductor memory device with reference to FIG. 4. Assuming now that the address signal is changed from the previous address assigned to a memory cell storing a data bit of logic "1" level to a new address assigned to a memory cell storing a data bit of logic "0" at time t11, the latching circuit 31d has already stored the output data signal indicative of logic "1" level, and the inverting circuits 31dc and 31dd produces the second controlling signal of the high voltage level.

At time t12, the address change discriminating circuit 33 lifts the timing pulse signal PS to the high voltage level, and the inverting circuit 31ee produces the complementary signal of the timing pulse signal PS. However, the internal read-out data signal DB indicative of the new data bit of logic "0" does not reach the controlling circuit 31a at time t12. The timing pulse signal PS of the high voltage level and the complementary signal thereof leave the first transfer gates 31ea and 31eb off, and allow the second transfer gates 31ec and 31ed to turn on. Then, the second transfer gates 31ec and 31ed transfer the second controlling signal to the gate electrodes of the p-channel enhancement type field effect transistor 2a and the n-channel type enhancement type field effect transistor 2b. With the second controlling signal of the high voltage level, the n-channel enhancement type field effect transistor 2b is shifted toward the on-state, and the p-channel enhancement type field effect transistor 2a is shifted toward the off-state. Then, the common drain node 2c and, accordingly, the output pin 3 go down to about 1.5 volts. Thus, the output pin 3 is preliminary shifted to an intermediate voltage level before reaching the internal read-out data signal DB indicative of the new data bit of logic "0" level. After the output pin 3 is decayed to the intermediate voltage level of about 1.5 volt, the internal read-out data signal DB reaches the controlling circuit 31a, and the NAND gate 1b and the NOR gate 1d yield the first controlling signal of the high voltage level.

Figure 2:
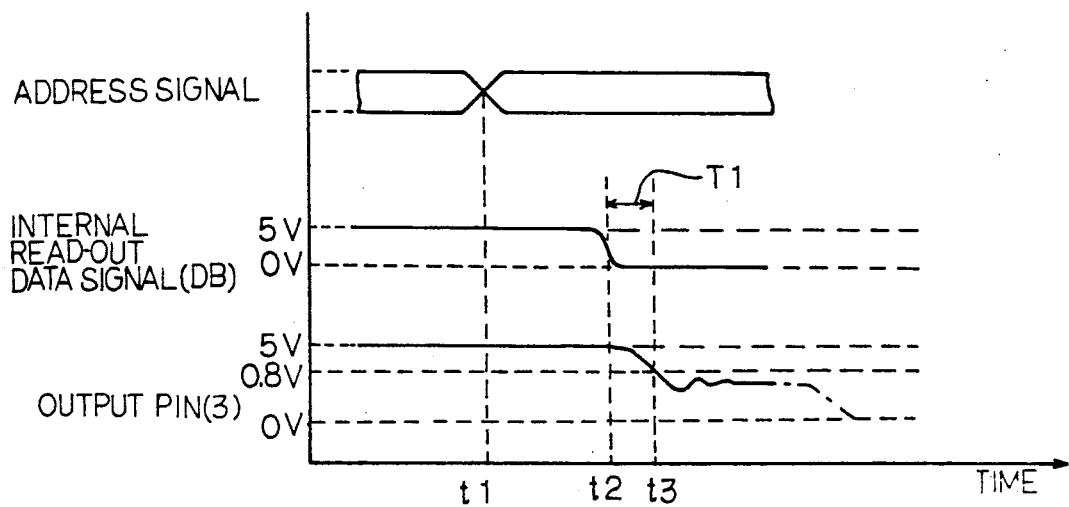
FIG. 2 is a timing chart showing the circuit behavior of the prior art output buffer unit.

At time t13, the timing pulse signal PS is recovered from the high voltage level to the low voltage level, and the timing pulse signal of the low voltage level and the complementary signal thereof cause the second transfer gates 31ec and 31ed to turn off. However, the first transfer gates 31ea and 31eb turn on, and the first controlling signal of the high voltage level is supplied to the gate electrode of the p-channel enhancement type field effect transistor 2a and the gate electrode of the n-channel enhancement type field effect transistor 2b. Then, the p-channel enhancement type field effect transistor 2a completely turns off, and the n-channel enhancement type field effect transistor 2b fully turns on. For this reason, the common drain node 2c and, accordingly, the output pin 3 go down from the intermediate voltage level of about 1.5 volts toward the ground voltage level. The common drain node 2c and the output pin 3 pass the discriminating level of TTL interface at time t14, and time period T11 from arrival of the internal read-out data signal DB to the discriminating level of about 0.8 volt is reduced in comparison with that T1 of the prior art output buffer unit (see FIG. 2). The intermediate voltage level is controllable by regulating the pulse width of the timing pulse signal PS, and the reason why the intermediate voltage level is adjusted to about 1.5 volts is that 1.5 volts is the mid point between discriminating levels of TTL interface are 2.2 volts and 0.8 volt.

If the internal read-out data signal DB is changed from logic "0" to logic "1" level, the common drain node 2c and, accordingly, the output pin 3 are also preliminarily shifted to the intermediate voltage level, and, thereafter, go up to the high voltage level of 5 volts. Since the intermediate voltage level is adjusted to the mid point between the two discriminating levels of TTL interface, the previously described advantages are also achieved.

As will be understood from the foregoing description, the output data signal indicative of the new data bit rapidly crosses over the discriminating levels. As a result the output buffer unit according to the present invention reduces the time period in which an external electronic device puts out valid data. Moreover, the voltage level at the output pin 3 is stepwise changed between the high voltage level and the ground voltage level through the intermediate voltage level, and, for this reason, the amount of current flowing into the ground node per unit time is surely decreased. This prevents the source of positive voltage level Vcc and the ground node from undesirable noise.

Second Embodiment

Figure 5:
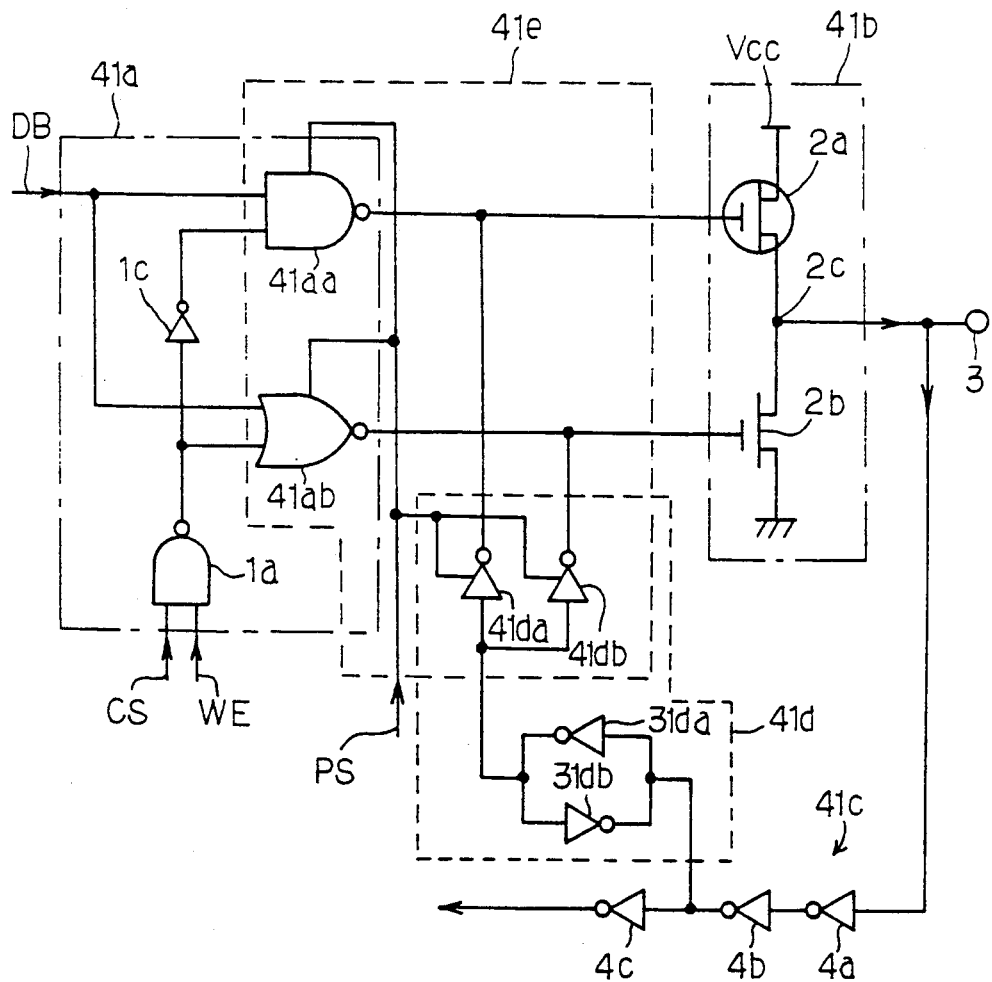
FIG. 5 is a circuit diagram showing the arrangement of another output buffer unit according to the present invention.

Turning to FIG. 5 of the drawings, another output buffer circuit embodying the present invention largely comprises a controlling circuit 41a, a driving circuit 41b, a series combination of inverting circuits 41c, a latching circuit 41d and a gating circuit 41e. The gating circuit 41e of the second embodiment is partially fabricated from a NAND gate 41aa and a NOR gate 41ab of the controlling circuit 41a and partially from inverting circuits 41da and 41db of the latching circuit 41d. However, other component circuit elements are similar to those of the first embodiment, and, for this reason, the same reference numbers used for the first embodiment designate the corresponding elements of the second embodiment, respectively.

Figure 6:
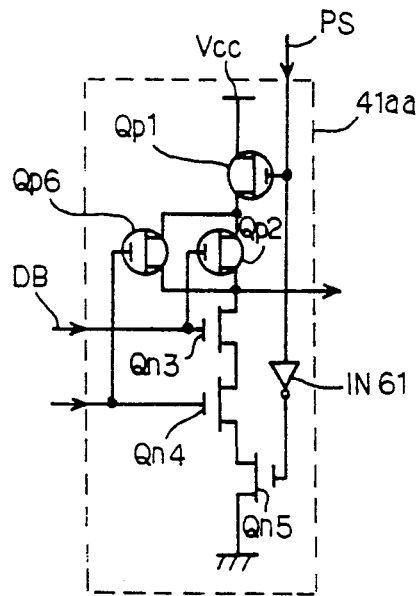
FIG. 6 is a circuit diagram showing the arrangement of a three-state NAND gate incorporated in the output buffer unit shown in FIG. 5.

In detail, the NAND gate 41aa is of the three-state type as shown in FIG. 6, and comprises a series combination of two p-channel enhancement type field effect transistors Qp1 and Qp2 and three n-channel enhancement type field effect transistors Qn3, Qn4 and Qn5 coupled between the source of positive voltage level Vcc and the ground node, a p-channel enhancement type field effect transistor Qp6 coupled in parallel to the p-channel enhancement type field effect transistor Qp2, and an inverting circuit 61. The two p-channel enhancement type field effect transistors Qp2 and Qp6 and the two n-channel enhancement type field effect transistors Qn3 and Qn4 achieve a NAND operation, and the p-channel enhancement type field effect transistor Qp1 and the n-channel enhancement type field effect transistor Qn5 force the NAND gate 41aa to enter a high-impedance state. In the high-impedance state, the NAND gate 41aa can not respond to the internal read-out data signal DB, because the p-channel enhancement type field effect transistor Qp1 and the n-channel enhancement type field effect transistor Qn5 isolate the field effect transistors Qp2, Qn3, Qn4 and Qp6 from both the source of positive voltage level Vcc and the ground node in the presence of the timing pulse signal PS of the high voltage level. The p-channel enhancement type field effect transistor Qp1, the n-channel enhancement type field effect transistor Qn5 and the inverting circuit IN61 form parts of the gating circuit 41e.

Figure 7:
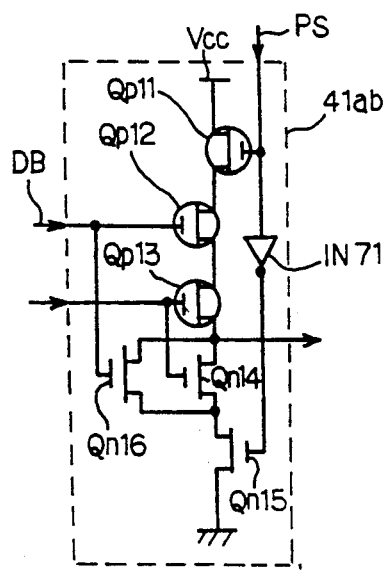
FIG. 7 is a circuit diagram showing the arrangement o a three-state NOR gate incorporated in the output buffer unit shown in FIG. 5.

Similarly, the NOR gate 41ab is of the three state type as shown in FIG. 7, and comprises a series combination of three p-channel enhancement type field effect transistors Qp11, Qp12 and Qp13 and two n-channel enhancement type field effect transistors Qn14 and Qn15 coupled between the source of the positive voltage level Vcc, and the ground node, an n-channel enhancement type field effect transistor Qn16 coupled in parallel to the n-channel enhancement type field effect transistor Qn14, and an inverting circuit IN71. The p-channel enhancement type field effect transistors Qp12 and Qp13 and the n-channel enhancement type field effect transistors Qn14 and Qn16 achieve a NOR operation, and the p-channel enhancement type field effect transistor Qp11 and the n-channel enhancement type field effect transistor Qn15 isolate the NOR gate 41ab from both the source of positive voltage level Vcc and the ground node in the presence of the timing pulse signal of the high voltage level. For this reason, the p-channel enhancement type field effect transistor Qp11 and the n-channel enhancement type field effect transistor Qn15 also form parts of the gating circuit 41e.

Figure 8:
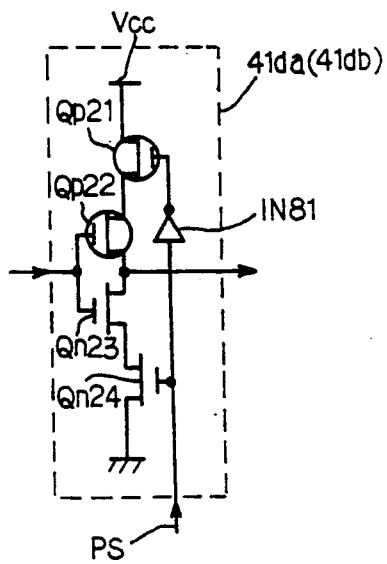
FIG. 8 is a circuit diagram showing the arrangement of a three-state inverting circuit incorporated in the output buffer unit shown in FIG. 5.

Each of the inverting circuits 41da and 41db is of the three-state type, and comprises a series combination of two p-channel enhancement type field effect transistors Qp21 and Qp22 and two n-channel enhancement type field effect transistors Qn23 and Qn24, and an inverting circuit IN81 as shown in FIG. 8. The p-channel enhancement type field effect transistor Qp22 and the n-channel enhancement type field effect transistor Qn23 achieve an inverting operation, and the p-channel enhancement type field effect transistor Qp21 and the n-channel enhancement type field effect transistor Qn24 isolate the field effect transistors Qp22 and Qn23 from both of the source of positive voltage level Vcc and the ground node in the absence of the timing pulse signal PS of the high voltage level. In other words, the p-channel enhancement type field effect transistor Qp21 and the n-channel enhancement type field effect transistor Qn24 force the inverting circuit 41da or 41db to enter the high-impedance state, and, accordingly, form parts of the gating circuit 41e.

In operation, while the timing pulse signal PS remains in the high voltage level, the NAND gate 41aa and the NOR gate 41ab are forced to be in the high-impedance state, and the inverting circuits 41da and 41db are activated to supply the second controlling signal to the driving circuit 41b. With the second controlling signal, the common drain node 2c and the output node 3 are preliminarily shifted to the intermediate voltage level. However, if the timing pulse signal PS is recovered from the high voltage level to the low voltage level, the inverting circuits 41da and 41db enter the high-impedance state, and the NAND gate 41aa and the NOR gate 41ab are activated to supply the first controlling signal to the driving circuit 41b. Therefore, the common drain node 2c and the output node 3 output rapidly crosses over one of the discriminating levels, and the operation speed is improved as similar to the first embodiment. The gating circuit 41e is implemented by the three-state circuits 41aa, 41ab, 41da and 41db, and no transfer gate is coupled between the controlling circuit 41a, the latching circuit 41d and the driving circuit 41b. This accelerates the propagation of the first and second controlling signals, and the operation speed is further improved.

Although particular embodiments of the present invention have been shown and described, it will be obvious to those skilled in the art that various changes and modifications may be made without departing from the spirit and scope of the present invention.

What is claimed is:

1. An output buffer unit comprising
    a) a controlling circuit responsive to an input signal for forming a first controlling signal,
    b) a driving circuit implemented by a series combination of a first transistor of a first channel conductivity type and a second transistor of a second channel conductivity type opposite to said first channel conductivity type, said first and second transistors being complementarily shifted between on and off states for producing an output signal at an output node between said first and second transistors,
    c) a latching circuit for temporarily storing a previous output signal supplied from said output node and producing a second controlling signal, and
    d) a gating circuit having a first input port coupled to said controlling circuit, a second input port coupled to said latching circuit and an output port coupled to said first and second transistors, and responsive to a timing signal for transferring said second controlling signal to said first and second transistors in a first phase of operation for establishing an intermediate voltage level between high and low voltage levels at said output node of said driving circuit, said gating circuit being operative to supply said first controlling signal to said first and second transistors in a second phase of operation after said first phase.

2. An output buffer unit as set forth in claim 1, in which said first controlling signal is opposite in logic level to said input signal and identical in logic level to said second controlling signal.

3. An output buffer unit as set forth in claim 2, in which said latching circuit comprises first inverting circuits arranged in a flip-flop configuration, and second inverting circuits coupled in parallel to the output node of said flip-flop configuration, said second controlling signal taking place at the output nodes of said second inverting circuits.

4. An output buffer unit as set forth in claim 3, in which said gating circuit comprises first transfer gate means coupled between said controlling circuit and said driving circuit, and second transfer gate means coupled between said latching circuit and said driving circuit, said timing signal complementarily shifting said first and second transfer gate means between on and off states.

5. An output buffer unit as set forth in claim 4, in which said first and second transfer gate means have a plurality of transfer gates each implemented by a parallel combination of a third transistor of said first channel conductivity type and a fourth transistor of said second channel conductivity type, said shifting circuit further comprising a third inverting circuit for producing a complementary signal of said timing signal, said timing signal and the complementary signal being thereof selectively supplied to said plurality of transfer gates.

6. An output buffer unit as set forth in claim 2, in which said controlling circuit comprises a three-state NAND gate responsive to said input signal, and a three-state NOR gate responsive to said input signal, said three-state NAND gate in an active state and said three-state NOR gate in an active state producing said first controlling signal, and in which said latching circuit comprises first inverting circuits arranged in a flip-flop configuration, and three-state second inverting circuits coupled in parallel to the output node of said flip-flop configuration, said second controlling signal taking place at the output nodes of said three-state second inverting circuits in an active state, said gating circuit being implemented by said three-state NAND gate, said three-state NOR gate and said three-state second inverting circuits selectively controlled between said active states and high-impedance states by said timing signal.

* * * * *

UNITED STATES PATENT AND TRADEMARK OFFICE
CERTIFICATE OF CORRECTION

PATENT NO. : 5,151,621
DATED : September 29, 1992
INVENTOR(S) : Hiroyuki GOTO

It is certified that error appears in the above-identified patent and that said Letters Patent is hereby corrected as shown below:

Col. 3, line 66, after "31da," insert --whereby--;

Signed and Sealed this

Nineteenth Day of October, 1993

Attest:

BRUCE LEHMAN

Attesting Officer        Commissioner of Patents and Trademarks